United States Patent
Denning

(10) Patent No.: US 7,095,211 B2
(45) Date of Patent: Aug. 22, 2006

(54) BATTERY GAS GAUGE

(75) Inventor: Bruce S. Denning, Monterey, CA (US)

(73) Assignee: O2Micro International Limited, Grand Cayman (KY)

(*) Notice: Subject to any disclaimer, the term of this patent is extended or adjusted under 35 U.S.C. 154(b) by 67 days.

(21) Appl. No.: 10/878,070

(22) Filed: Jun. 28, 2004

(65) Prior Publication Data

US 2005/0231206 A1 Oct. 20, 2005

Related U.S. Application Data

(60) Provisional application No. 60/563,163, filed on Apr. 16, 2004.

(51) Int. Cl.
*H02J 7/00* (2006.01)

(52) U.S. Cl. .................... 320/132; 324/433

(58) Field of Classification Search ............ 320/132, 320/134, 136, 149; 324/427, 429, 432, 433
See application file for complete search history.

(56) References Cited

U.S. PATENT DOCUMENTS

| | | | | |
|---|---|---|---|---|
| 4,573,126 A | * | 2/1986 | Lefebvre et al. | 702/63 |
| 5,166,623 A | * | 11/1992 | Ganio | 324/427 |
| 5,808,445 A | * | 9/1998 | Aylor et al. | 320/132 |
| 6,127,806 A | * | 10/2000 | Tanjo et al. | 320/132 |
| 6,198,254 B1 | * | 3/2001 | Satake et al. | 320/132 |
| 6,268,711 B1 | * | 7/2001 | Bearfield | 320/117 |
| 6,285,163 B1 | * | 9/2001 | Watanabe et al. | 320/132 |
| 6,366,054 B1 | * | 4/2002 | Hoenig et al. | 320/132 |
| 6,392,415 B1 | * | 5/2002 | Laig-Horstebrock et al. | 324/433 |
| 6,563,318 B1 | * | 5/2003 | Kawakami et al. | 324/426 |
| 2004/0128086 A1 | * | 7/2004 | Barsoukov et al. | 702/63 |

OTHER PUBLICATIONS

English translation of Taiwan Office Action dated Jun. 21, 2005.

* cited by examiner

*Primary Examiner*—Karl Easthom
*Assistant Examiner*—Samuel Berhanu
(74) *Attorney, Agent, or Firm*—Grossman, Tucker, Perreault & Pfleger, PLLC

(57) ABSTRACT

Full capacity determination in a battery gas gauge. Operations include measuring instantaneous open circuit voltage levels during an open circuit time interval for a specific battery cell and correlating such measurements to estimate values. Such estimated values may then be correlated to associated relative state of charge levels. Finally, a full capacity calculation can be made based on the associated relative state of charge levels. A plurality of full capacity determinations may also be made and compared to each other to assess the reliability of such determinations.

20 Claims, 6 Drawing Sheets

BATTERY GAS GAUGE

CROSS REFERENCE TO RELATED APPLICATIONS

This application claims the benefit of the filing date of U.S. Provisional Application Ser. No. 60/563,163, filed Apr. 16, 2004, the teachings of which are incorporated herein by reference.

FIELD

The present disclosure relates to battery gas gauges for electronic devices, and more particularly in one embodiment to full capacity determination in such battery gas gauges.

BACKGROUND

A variety of electronic devices such as laptop computers, personal digital assistants, cell phones, etc. may be powered by a battery. The battery may be a rechargeable battery of a variety of types such as a nickel cadmium, nickel metal hydride, or lithium ion. Such rechargeable batteries may be recharged whenever a suitable DC power source, e.g., an AC/DC adapter, is coupled to the electronic device.

It is desirable for a user to be able to monitor the charge on the battery to know when recharging of the rechargeable battery is necessary. There are a variety of battery gas gauge devices known in the art for estimating the remaining capacity of the battery based on a variety of monitored conditions. Such gas gauges typically present the remaining capacity of the battery as a percentage of some full capacity determination.

When a battery cell is manufactured its initial full capacity can be directly measured. Thereafter, charge flow into and out of the cell can be measured by appropriate Coulomb counting circuitry. Unfortunately, factors such as cell aging may cause the full capacity level at some future time interval to be less than the initial full capacity level. Further factors such as cell self discharge may cause the current capacity level to become increasingly less accurate as time passes.

One typical solution to these accumulated inaccuracies is to discharge a cell to a point near a discharge cutoff voltage level, Vdc, (discharging below the Vdc level may damage the cell). When the cell is discharged to this point, the estimated remaining capacity (Cer) can be inferred from a voltage measurement at time t measured across the cell terminals at the current charge/discharge rate. If the cell is then charged without interruption to full capacity, the estimated remaining capacity, as previously determined, plus the charge accumulated during the charge cycle as measured by Coulomb counting for instance, equals the new full capacity. For example, at time t, the voltage may be 3.0 volts at a terminal discharge rate of about 2A. This data may then by used to index a lookup table to yield estimated remaining capacity at that point in time, e.g., 0.2 Ampere-hour (AH) for a 2 AH cell. Coulomb counting during charging may then show an accumulated charge of 1.75 AH so the full capacity determination would equal 0.2 AH plus 1.75 AH or 1.95 AH. This is sometimes referred to as a "qualified discharge/charge cycle."

However, this approach has several drawbacks. First, the estimated remaining capacity Cer inferred from the voltage measurement at the end of discharge may be considerably in error. This is because it depends on the behavior of the effective internal resistance of the cell, which can be difficult to predict in a practical gas gauge design. Second, this approach requires that the cell be discharged to a near empty state before measurement begins for Coulomb counting. If this does not occur within several cycles of normal usage, then the gas gauge may be required to request a "conditioning cycle" (forced qualified discharge cycle) to restore the gas gauge to the required accuracy. This requirement may add hardware cost and create user inconvenience. Third, the user might not be willing to wait for the cell to reach a completely charged state. If the user terminates the charge prematurely, the final charge capacity can be estimated but this introduces a source of error.

BRIEF DESCRIPTION OF THE DRAWINGS

Advantages of the present invention will be apparent from the following detailed description of exemplary embodiments thereof, which description should be considered in conjunction with the accompanying drawings, in which.

DETAILED DESCRIPTION

Figure 1:
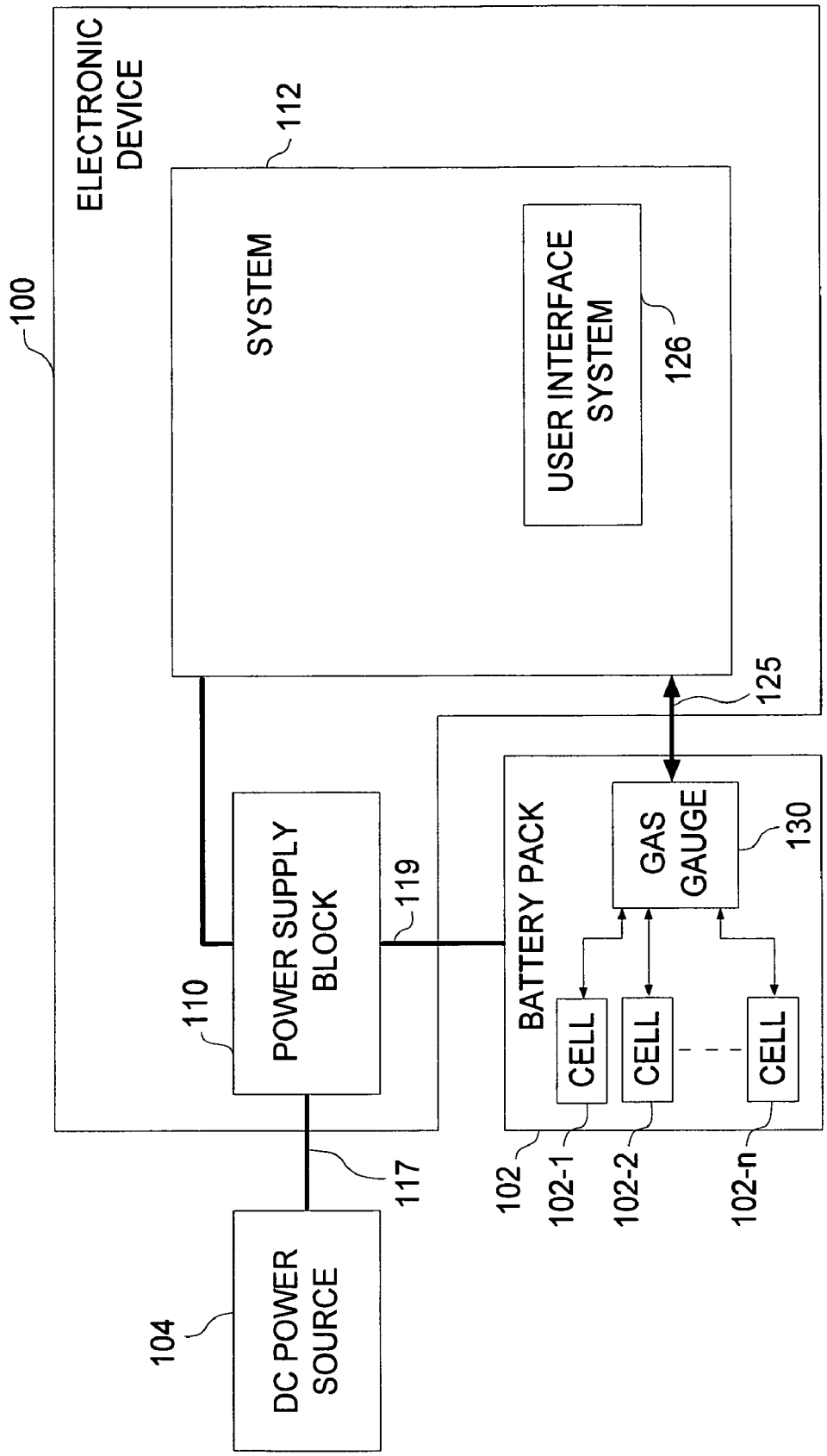
FIG. 1 is a block diagram of an electronic device including a gag gauge circuit.

Before turning to a more detailed discussion of various embodiments, several terms and associated abbreviations as used herein are defined below.

Charge Cutoff Voltage (Vcc): A voltage level above which charging of an associated cell or battery above this level may damage the cell or battery. Hence, charging may be terminated at such a voltage level.

Discharge Cutoff Voltage (Vdc): A voltage level below which discharging of an associated cell or battery below this level may damage the cell or battery. Hence, discharging may be terminated at such a voltage level.

Full Capacity (Cft): The total number of ampere-hours than can be withdrawn from a fully charged cell or battery at some time 't'. Cf0 is the full capacity at time of manufacture. Cft may vary from Cf0 as the cell ages: it may (or may not) increase slightly in the first few charge/discharge cycles, but thereafter it will typically decrease as the cell ages.

Remaining Capacity (Ct): The (remaining) total number of ampere-hours that can be withdrawn from a partially charged cell or battery. The Ct and Cft terms refer to the low discharge rate (total, true) cell capacities, not the "available" capacities which may be reported by (for example) typical battery gauges. When a cell reaches Vdc at a typical operating discharge current, there is still some small residual capacity (Crt) remaining in the cell. Since it is desirable to report zero remaining capacity at the exact time that Vdc forces discharge termination, is customary to report Available Capacity (ACt)=Ct−Crt.

Relative State of Charge (RSOC): The relative amount of capacity remaining in a cell or battery. The RSOC may be expressed as a percentage of the remaining capacity to full capacity given by RSOC=100*Ct/Cft.

Instantaneous Cell Open Circuit Voltage (Voct). The voltage level across the terminals of a battery cell when the cell is disconnected from a circuit (neither charging nor discharging). Voct can be measured by setting the discharging or charging current to zero. This may not be practical during discharge, but may be more practical when the battery cell is idle (neither charging nor discharging) or during short interruptions in the charge cycle. Voct may vary depending on a variety of factors. For example, after discharge termination Voct may increase (sometimes called rebound), and during charge interruptions it may decrease (sometimes called sag).

Theoretical Cell Potential Voltage or True Open Circuit Voltage (Vcpt): The true voltage level across the terminals of a battery cell when the cell is disconnected from a circuit (neither charging nor discharging). If the charging current is set to zero for long enough during a charge interruption (hours or days), Voct will approach Vcpt. The value of Vcpt is the anode potential minus the cathode potential, where both anode and cathode potentials vary as a function of RSOCt (varies during charge and discharge) and cell chemistry design (fixed at production), and other (hopefully second order) effects such as temperature. RSOCt can be inferred from Vcpt. Vcpt can not be directly measured.

Voltage across cell terminals (Vt): Vt is the voltage level across the cell terminals. The Vt value may be measured while the battery is charging or discharging at an associated charge/discharge rate.

Estimator Value (Ecpt): Ecpt is an estimator value for Vcpt which may be derived from Voct measurements made during short interruptions in the charge cycle.

Turning to FIG. 1, a simplified block diagram of an electronic device 100 capable of being powered from a battery pack 102 via path 119 or a DC power source 104 via path 117 is illustrated. The electronic device 100 may be any variety of electronic devices such as a laptop computer, cell phone, personal digital assistant, power tool, and the like. The battery pack 102 may contain a plurality of battery cells 102-1, 102-2, 102-n. The cell types may be of various rechargeable types known in the art such as lithium-ion, nickel-cadmium, nickel-metal hydride batteries, or the like.

To recharge the battery pack 102 and/or supply power to the system 112, a DC power source 104 may be coupled to the device 100. The DC power source 104 may be an AC/DC adapter which is configured to receive conventional 120 volts AC from a wall outlet and convert it to a DC output voltage. The DC power source 104 may also be a DC/DC adapter such as a "cigarette lighter" type adapter configured to plug into that type of socket. Such a DC power source 104 is illustrated in FIG. 1 as separate from the device 100, but it may be built into some devices. The electronic device 100 may also have a power supply block 110. In general, the power supply block 110 may include various components to monitor, control, and direct power from each power source 102, 104 to each other and to the system 112 of the electronic device 100 under various conditions. The user interface system 126 may include one or more devices for a human user to input commands and/or data and/or to monitor the system 100 such as, for example, a keyboard, pointing device, and/or video display.

Figure 2:
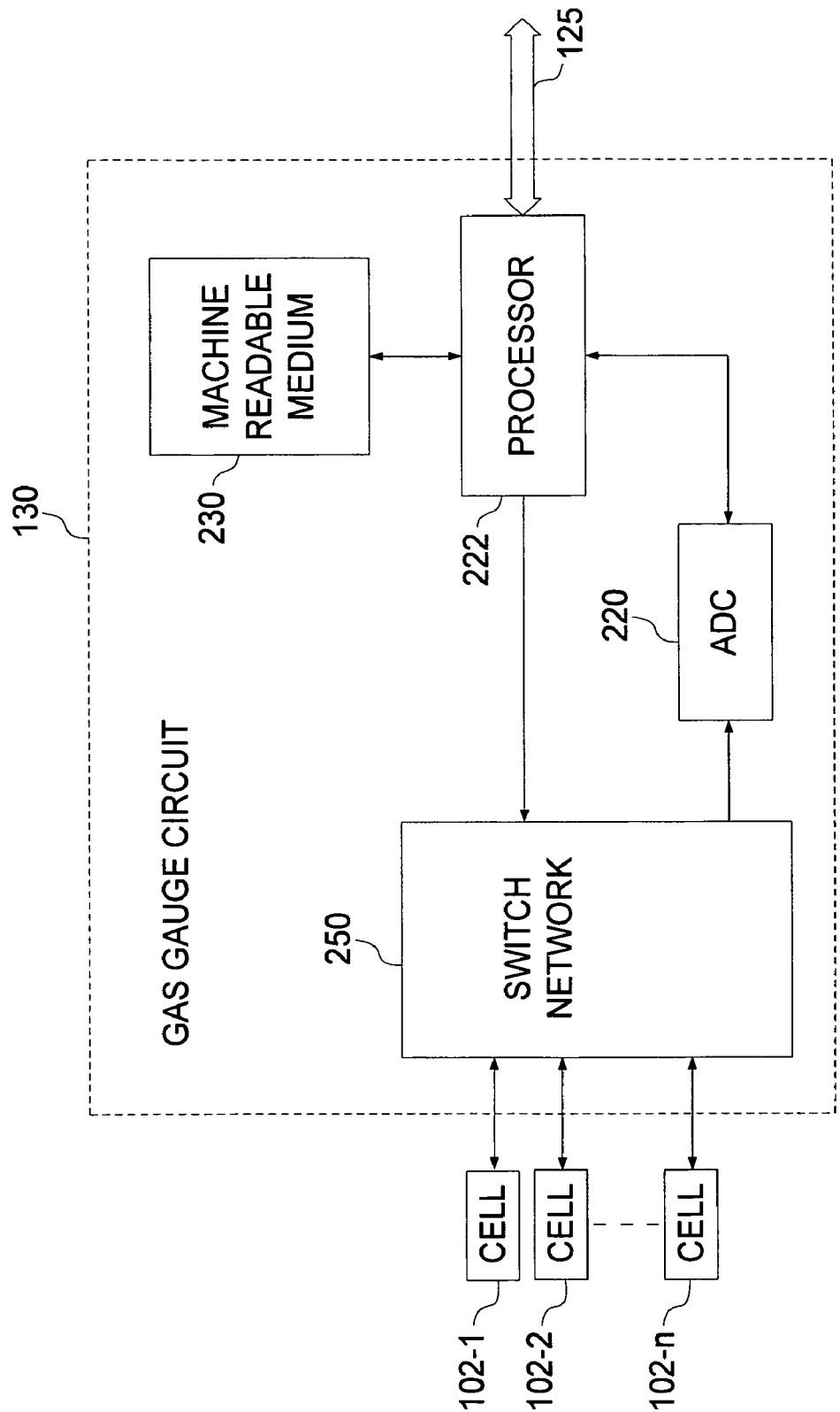
FIG. 2 is a block diagram of an embodiment of the gas gauge circuit of FIG. 1.

FIG. 2 is a block diagram of the gas gauge (GG) circuit 130 of FIG. 1. The gas gauge circuit 130 may be included in the battery pack 102 as illustrated in FIG. 1, but may also be located anywhere in the electronic device 100. The gas gauge circuit 130 may generally include a switch network 250, an analog to digital converter (ADC) 220, a processor 222, and a machine readable medium 230.

The switch network 250 may include a plurality of switches to couple any one of the cells 102-1, 102-2 . . . 102-n to the ADC 220. The ADC 222 may be any variety of analog to digital converter to convert analog signals to associated digital signals such as a single-slope integrating ADC, a dual-slope integrating type ADC, or a sigma-delta type ADC to name a few. The processor 222 may be any variety of processor or controller for executing instructions to accomplish a variety of operations. The machine readable medium 230 may a variety of mediums such as erasable programmable read only memory (EEPROM) or random access memory (RAM) to name just a couple, e.g., to 32 bytes of general purpose RAM in some instances.

In general, the processor 222 may instruct the switch network 250 to open and close various switches in the switch network to couple various terminals of the cells to the ADC 220. The ADC 220 may then convert an input analog signal provided via the switch network to an associated digital signal and provide such digital signal to the processor 222. The processor 222 may then execute instructions stored in the machine readable medium 230 to accomplish a variety of operations.

The gas gauge circuit 130 may make any number of determinations based on monitored parameters such as various voltage levels including remaining and full battery capacity determinations. The gas gauge circuit 130 may communicate results of its various determinations with the electronic device via path 125. The results of the battery capacity determinations may then be presented to a user of the electronic device 100 in a variety of formats via a user interface system 126 of the electronic device. For example, remaining capacity (Ct) and/or relative state of charge and/or estimated available operating time may be displayed on a video display of the user interface system 126 in any variety of formats. The user interface system 126 may also include audible devices to provide an audio indication in certain instances, e.g., to provide an audible alarm if the gas gauge circuit 130 senses a low battery condition.

Figure 3:
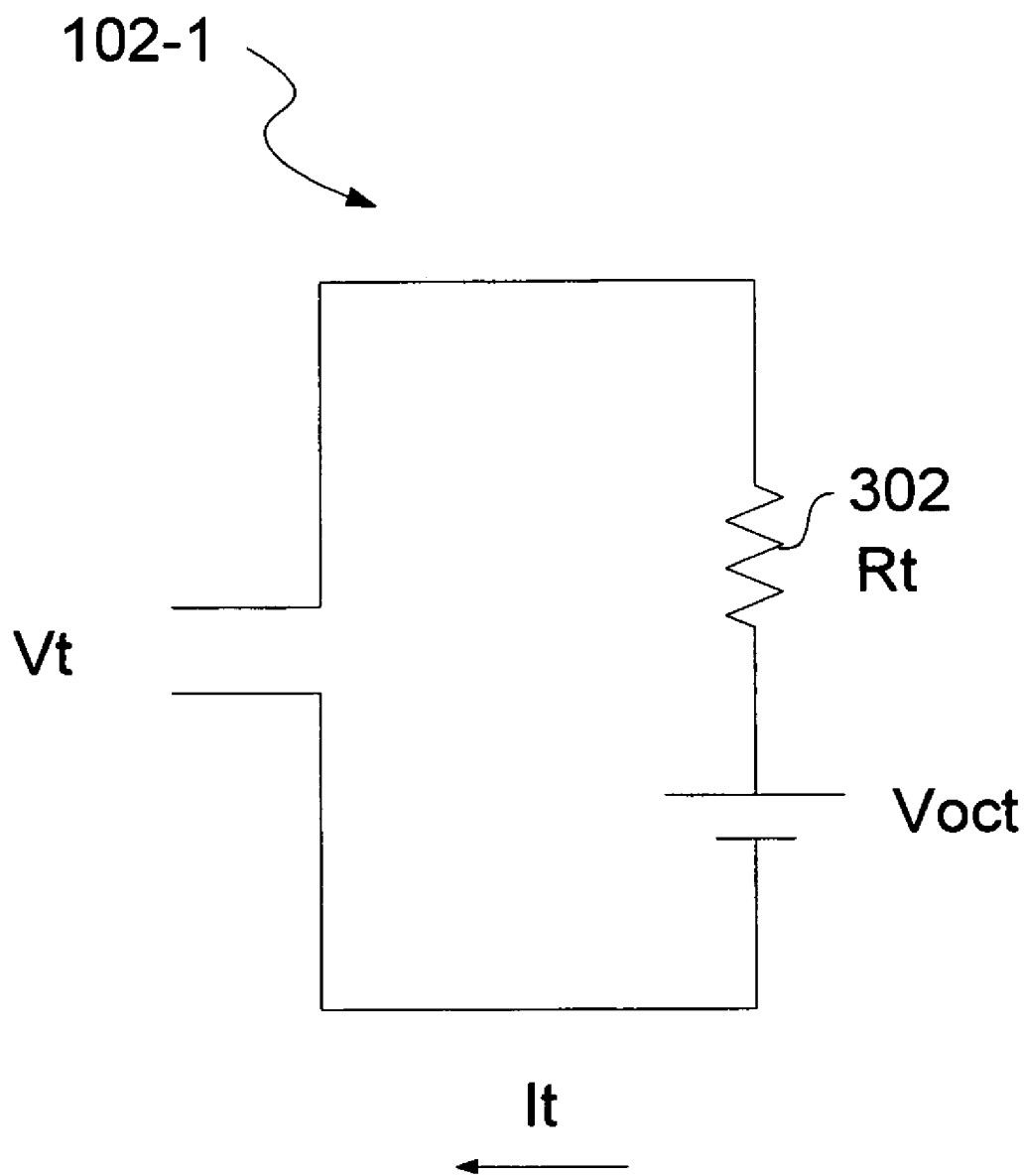
FIG. 3 is an equivalent circuit diagram of a battery cell of FIG. 1.

Turning to FIG. 3, a simplified cell equivalent circuit diagram for one of the cells 102-1 of the battery back 102 of FIG. 1 is illustrated. The cell equivalent circuit diagram generally includes a voltage level at time 't' (Vt) as measured across the cell terminals of the cell equivalent circuit at the current charge/discharge rate. The cell equivalent circuit diagram may also include resistor 302. Resistor 302 represents the resistance at time 't' (Rt) or the effective internal (series) resistance of a cell at time 't'. The cell equivalent diagram also includes a open circuit voltage at time 't' value (Voct). The charging/discharging current at time "t" in the series circuit may be represented by It. Voct and Rt may change in a quite dynamic manner. For example in Lithium Ion cells, after a typical operating discharge current is discontinued, Voct will gradually increase ("rebound") until it finally approaches the theoretical cell potential Vcpt (sometimes called "true open circuit voltage"). Voct may be measured by setting It=0. Direct Vcpt measurements are not so easily obtained, and typically require waiting hours (or days) for Voct to stabilize after charge or discharge.

Since Rt is greater then zero, Vt will be less than Voct during discharge. Therefore, if discharge is stopped when the cell terminal voltage reaches the discharge cutoff voltage, Vdc, then some estimated remaining capacity (Cer) will remain in the cell at the end of discharge. In general, Rt typically increases as the number of charge/discharge cycles increases. Therefore, the available voltage (Vt) at some specific It and RSOC typically decreases as the cell ages.

Figure 4:
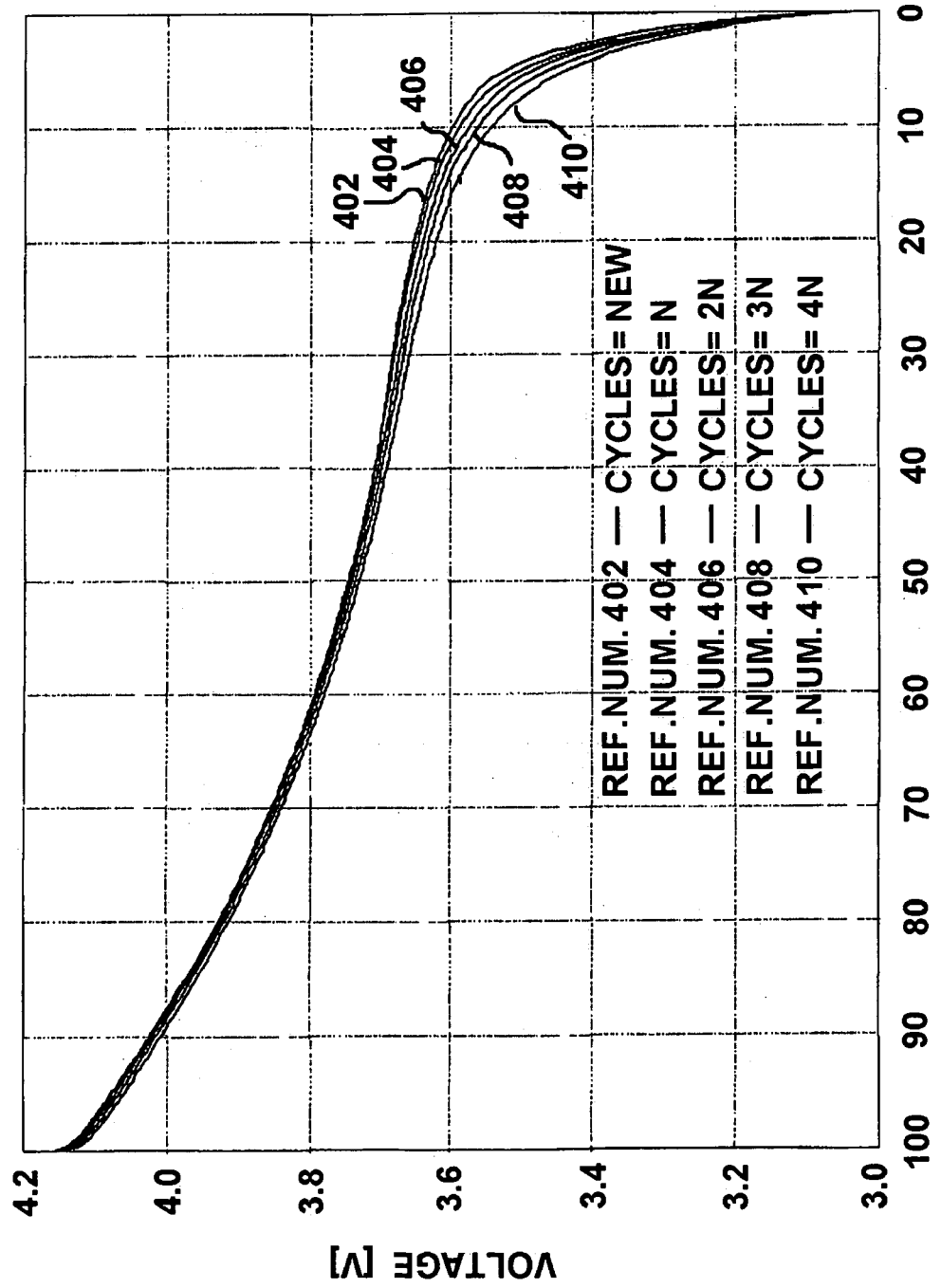
FIG. 4 is a plot of voltage versus relative state of charge for various cell ages in cycles.

FIG. 4 illustrates various plots of Vt versus RSOCt expressed as a percentage for a variety of cell ages in cycles. Plot 402 illustrates a plot of Vt versus RSOCt for a new cell. Plot 304 illustrates a plot of Vt versus RSOCt after n charge/discharge cycles. Plot 406 illustrates a plot of Vt versus RSOCt after 2n charge/discharge cycles. Plot 408 illustrates a plot of Vt versus RSOCt after 3n charge/discharge cycles. Finally, plot 410 illustrates a plot of Vt versus RSOCt after 4n charge/discharge cycles. The voltage levels for plot 402 are generally higher than for other plots.

As illustrated, the voltage level generally decreases as the number of charge/discharge cycles increases at various RSOCt values, due to an increase in the internal resistance of the cell as the cell ages. In particular, this voltage difference is generally greatest at relatively lower states of charge when RSOCt is between about 5% and 20%. If the discharge current was decreased, the plots would become more similar to each other until they become essentially identical as the current is reduced to zero.

In, at least, Lithium Ion cells, the theoretical cell potential (Vcpt) is directly, even if non-linearly, related to the relative state of charge (RSOCt) in a fashion that is relatively insensitive to cell age and temperature. If Vcpt is known, then the RSOCt can be ascertained, e.g., from a lookup table. Unfortunately, the theoretical open circuit voltage Vcpt cannot be directly measured. This is because even if a charging or discharging cell is removed from its circuit, the cell terminal voltage Voct will continue to change, only slowly approaching Vcpt. However, other voltage levels and conditions can be directly measured that can then be correlated to Vcpt using a calculated estimator value Ecpt.

Figure 5:
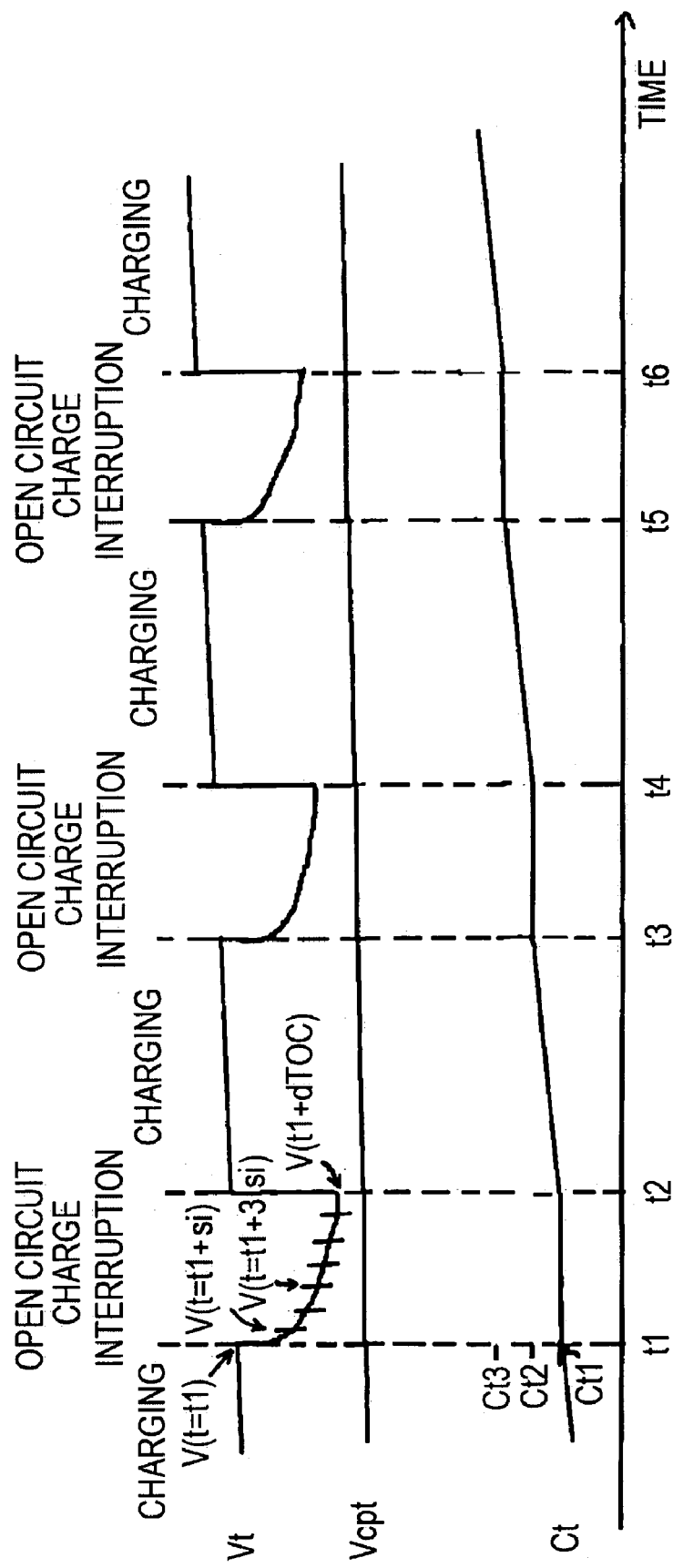
FIG. 5 is a plot of voltage values over time during a plurality of open circuit time intervals for a cell of FIG. 1.

Turning to FIG. 5, plots of Vt, Vcpt, and Ct are illustrated during a charging mode for a particular cell. Charging interruptions are illustrated as occurring at a first time interval between times t1 and t2, a second time interval between times t3 and t4, and a third time interval between times t5 and t6. During each charge interruption time interval, measurement(s) of Voct (Vt during open circuit condition when charging current is zero) may be taken. The Voct value may then be correlated to an estimated Ecpt value representative of the theoretical open circuit voltage for each interruption time interval. A relative state of charge level RSOC associated with each interruption time period may then be ascertained. By utilizing any two of the interruption time intervals, a full capacity level may be calculated as the difference between capacity levels at each interruption time interval divided by the difference between the relative state of charge levels for the same interruption time intervals.

For instance, during the first interruption time interval between times t1 and t2, the charge (or discharge) cycle may be interrupted by removing the cell from its associated circuit thereby creating an open circuit. In one embodiment (FIG. 2), this may be accomplished by the processor 222 instructing the switch network 250 to open a particular battery cell circuit containing a particular battery cell 102-1, 102-2 . . . 102-n of interest.

During the open circuit time interval between times t1 and t2, the voltage level Voct (which equals Vt during this time interval) may be measured. Correlating the Voct voltage to the Ecpt value may occur, in one instance, by deriving the Ecpt value as a value representing Voct at some constant time interval after the charging/discharging current is interrupted. In this instance, only one Voct value need be taken at the constant time interval after the charging/discharging current is interrupted.

In another method of deriving Ecpt from Voct, multiple samples of Voct may be taken over a plurality of sampling time intervals. The Ecpt value may then be a value representing the projected final end point of the measured Voct values using mathematical analysis.

FIG. 5 illustrates such sampling intervals (si) for the first interruption time interval between times t1 and t2. Voct may be measured at a first sampling time interval V (t=t1+si) and may also be measure at successive time intervals. The total number of measurements taken depend on the length of the interruption time between times t1 and t2 (dTOC) and the sampling interval (si). The sampled Voct values may then be utilized along with other relevant information (such as the average charge current before the charge interruption) to correlate such sampled values to an Ecpt value.

The Ecpt estimate derived by any of the techniques above may be further enhanced by applying correction factors for other system conditions, so the Ecpt becomes less sensitive to any system condition except RSOC. For example, Voct measured during charge interruptions is highly sensitive to variations in charge current. By using (for example) Ecpt=Voct−(C0+C1* Icharge, where C0 and C1 are empirically derived constants and Icharge is the average charge current prior to the charge interruption) we can create an estimator which is relatively insensitive to charge current, and therefore usable in a wider range of operating conditions. Constants C0 and C1 may be empirically derived by interrupting charging at various charging current levels and measuring Voct during those charge interruption times. A standard linear fitting technique such as "least mean square error" may then be utilized from the observed data at the multiple charge current rates. This may not only be utilized to derive C0 and C1 but the measured residual error may indicate the effectiveness of the linear correction. Other corrections for temperature, etc, can be added with the goal of creating an Ecpt which is dependent solely on RSOCt, with minimum effects from other independent variables.

Once an Ecpt value is obtained by any of these or other various methods, a Cft value may then be calculated from RSOCt and Ct values obtained from any combination of two interruption time intervals. An illustrative example of two cases is presented for explanation with reference to FIG. 5.

Case 1. Ct known/correct:

Charge interruption 1: Ct1=1000 mah, RSOC1[Ecpt]=50%

Charge interruption 2: Ct2=1200 mah, RSOC2[Ecpt]=60%

Charge interruption 3: Ct3=1400 mah, RSOC3[Ecpt]=70%

The difference between Ct1 and Ct2 and RSOC1 and RSOC2 for the first interruption time interval (between times t1 and t2) and the second interruption time interval (between times t3 and t4) would yield a delta Ct of 200 mah and delta RSOC of 10%. Therefore, the calculated full capacity Cft would be 200 mah/10%=2,000 mah. This same result would occur if the difference between Ct2 and Ct3 and RSOC2 and RSOC3 for the second interruption time interval and third interruption time interval (between times t5 and t6) was analyzed (200 mah/10%=2,000 mah). This same result would also occur if the difference between Ct1 and Ct3 and RSOC1 and RSOC3 for the first interruption time interval and third interruption time interval was analyzed (400 mah/20%=2,000 mah). In this ideal case, we get the same Cft results considering any of the interruption pairs (1, 2), (2, 3), and (1, 3), giving us excellent confidence that Cft is correct (if the table or measurements were incorrect, we could not expect this agreement.)

Case 2: Like case 1, but Ct is incorrect (low by 200 mah):

Charge interruption 1: Ct1=800 mah, RSOC1[Ecpt]=50% (RSOC1 [Ecpt] does not depend on Ct, and does not change).

Charge interruption 2: Ct2=1000 mah, RSOC2[Ecpt]=60%

Charge interruption 3: Ct2=1200 mah, RSOC2[Ecpt]=70%

The same calculations performed in Case 1 will yield the same results in Case 2 or Cft=2,000 mah for any of the interruption pairs (1, 2), (2, 3), and (1, 3) since the calculations do not depend on the initial state of Ct (heavily dependent on the possibly inaccurate estimate of Cer). Rather, the calculations depend on the change in capacity for each interruption pair which is derived from relatively accurate coulomb counting. This approach gives us two advantages over a Cft=100*Ct/RSOC approach:

1. It does not require an accurate Ct, only an accurate delta Ct (Cer not needed).
2. Since the charge cycle may be interrupted at three or more different time intervals, two or more independent estimates of Cft may be made. This enables the reliability of the Cft measurements to be assessed by comparison to each other. Approaches which rely on a single Voct=Vcpt measurement after considerably long open circuit delays do not have this advantage.

Relative Capacity Table (Trc) Construction

Consider the following example of a relative capacity table at the beginning of a hypothetical first (controlled, in factory) charge cycle:

TABLE 1a

| Index: i | Target RSOC: Trc.RSOCi | Ecpt at target RSOCt: Trc.Ecpi | Capacity at target RSOCt: Trc.Ct |
|---|---|---|---|
| 1 | 0.20 | ? | ? |
| 2 | 0.40 | ? | ? |
| 3 | 0.60 | ? | ? |
| 4 | 0.80 | ? | ? |

The cell specified/expected full capacity Cfs, for example 2000 mah, may be known. The exact Cft for the given cell may not be known, but it may be determined during the table construction process. The Ct values may be measured during the charging process using accurate coulomb counting. It is also known that the initial cell capacity Ct is very close to some known value (such as zero) as an artifact of the cell manufacturing and test process.

The desired result is a Trc.RSOCi vs. Trc.Ecpi table for the example target RSOCt target values. A number of RSOCt targets may be utilized. In general, a larger number of RSOCt targets that does not cause an objectionable extension of the charge cycle is desirable. The table index 'i' need not be stored in the table. It is shown here only for clarity. The Trc.Ct entries in Table 1a are intermediate data, and need not be stored with the final table.

To build the table, the cell may be charged in a controlled manner, e.g., a charge profile similar to actual in-service use. The charging mode may be interrupted four times and Trc.Ecpi may be determined at each interruption. The charging mode may be interrupted when Ct reaches each target RSOCt.: Ct[i]=Trc.RSOCi[i] *Cfs. For example, when i=1, charging may be interrupted when Ct is 400 mah (Ct=0.20*2000-400 mah). This charging mode may be interrupted four times until charging is complete. At this point, the actual full capacity is known yielding the results in Table 1b.

TABLE 1b

Cft = 2050 mah

| Index: i | Target RSOCt: Trc.RSOCi | Ecpt at interruption: Trc.Ecpi | Capacity at interruption: Trc.Ct |
|---|---|---|---|
| 1 | 0.20 | 3.652 | 400 |
| 2 | 0.40 | 3.707 | 800 |
| 3 | 0.60 | 3.783 | 1200 |
| 4 | 0.80 | 3.914 | 1600 |

Since the actual full capacity Cft (2,050 mah) did not exactly match the specified full capacity Cfs (2,000 mah), the actual Trc.RSOCi values do not exactly match the target Trc.RSOCi values in Table 1b. Since the actual values are desired, the target values may be replaced with the actual values using the measured data and the following relationship: Trc.RSOCi[i]=Trc.Ct[i]/Cft. The actual RSOCt and Ecpt at RSOCt may be stored as detailed in Table 1c for future use. For example, with an actual Cft of 2,050 mah the actual RSOCt at i=1 would be 400 mah/2,050 mah or 0.1951.

TABLE 1c

| Index: i | Actual RSOCt: Trc.RSOCi | Ecpt at RSOCt: Trc.Ecpi |
|---|---|---|
| 1 | 0.1951 | 3.652 |
| 2 | 0.3902 | 3.707 |
| 3 | 0.5853 | 3.783 |
| 4 | 0.7805 | 3.914 |

Table 1c may then be stored, e.g., in the machine readable medium 230 of the gas gauge circuit 130 of FIG. 2 in one embodiment. In the future, charging may be interrupted at the new actual RSOCi points above, not the original target RSOCt points. This minimizes the Trc.Ecpi interpolation error that might occur (due to intrinsic Vcpt nonlinearity, and other effects) if measurements at the original target RSOCt points were taken.

Table 1c may be constructed and stored for each individual cell. Alternatively, Table 1c may be constructed for one cell representative of closely related cells and that table may be used as the initial Trc for a production run of closely related cells. The algorithm should account for changes in each cell as it ages in any case. Therefore, it should be able to accommodate the small variations in production cell runs and/or correctly identify cells which vary significantly from the other cells in a production lot, and should therefore be rejected.

Estimating Cft by Use of Trc During an In-service Charge Cycle

To estimate Cft from Trc, Trc.Ct and Trc.Ecpt values may first be collected from charge interruptions at points close to the Trc.RSOCi/Trc.Ecpi values in previously constructed and stored table, e.g., Table 1c. The system conditions (charge current, etc.) should be as similar as practical to the conditions used to build the initial table. In practical terms, this means that the initial table construction should be made in conditions as similar as practical to the in-service conditions.

One method of determining each charge interruption point is to interrupt charge each time Ct reaches a table RSOCi point: Ct/Cft=Trc.RSOCi. In this case, charging need only be interrupted at each Trc.RSOCi point.

Another approach is to interrupt charge at least one additional time before at least the first targeted interruption, and to determine one or more initial Ecpt values, and then extrapolate to an interruption point for the desired Ecpi value. Other improvements in interruption point accuracy and required time are also possible.

A typical charge cycle may not, and need not, cross all of the Trc.RSOCi points in Table 1C. This is because the Cft calculation requires only two data points, and the quality estimate described below requires only three data points.

A method for determining Cft and Ct from collected data is demonstrated in Table 2a. In this example, the actual Cft is 2050 mah which is similar to that detailed in Table 1b and 1c. The measured Ct is in error by +50 mah due to an assumed Cer error. Trc.Ecpt values have been slightly perturbed to simulate the effects of measurement error. An initial battery capacity at start of charge in excess of 400 mah is assumed, so that no data could be collected at the first interruption point (i=1).

TABLE 2a

| Index: i | Actual RSOCt: Trc.RSOCi | Ecpt at RSOCt: Trc.Ecpi | Capacity at interruption: Trc.Ct | Ecpt at interruption: Trc.Ecpt | Interpolated RSOCt Trc.IRSOCi |
|---|---|---|---|---|---|
| 1 | 0.1951 | 3.652 | — | — | — |
| 2 | 0.3902 | 3.707 | 800 measured, 750 true | 3.700 | .3653 |
| 3 | 0.5853 | 3.783 | 1200 measured, 1150 true | 3.773 | .5600 |
| 4 | 0.7805 | 3.914 | 1600 measured, 1550 true | 3.898 | .7566 |

In Table 2a, each Trc.Ecpt may be determined at a charge interruption point, Trc.IRSOCi. This charge interruption point Trc.IRSOCi may be calculated using linear interpolation between two points in the table as detailed in equation (1):

$$Trc.IRSOCi[i]=Trc.RSOCi[a]+(Trc.RSOCi[a]-Trc.RSOCi[b])*(Trc.Ecpt[i]-Trc.Ecpi[a])/(Trc.Ecpi[a]-Trc.Ecpi[b]) \quad (1)$$

where 'a'=the index of the Trc.Ecpi value closest to Trc.Ecpt [i], and 'b'=the index of the Trc.Ecpi value next closest to Trc.Ecpt[i]. In a similar manner, linear extrapolation may be used to calculate Trc.IRSOCi for points lying slightly outside the table. Other forms on interpolation or extrapolation may also be used.

The Cft estimate may be made by considering the difference between Trc.Ct and Trc.IRSOCt for any two charge interruptions detailed in equation (2).

$$Cft=(\text{delta } Ct)/(\text{delta } RSOC) \quad (2)$$

The results of such calculations applying equation (2) to the data of Table 2a are detailed in Table 2b.

TABLE 2b

| indices: i1, i2 | Delta IRSOCi: | Delta Ct | Cft estimate |
|---|---|---|---|
| 2, 3 | 0.1947 | 400 | 2054 |
| 3, 4 | 0.1966 | 400 | 2035 |
| 2, 4 | 0.3913 | 800 | 2044 |

For example, the Delta IRSOCi for interruption at points i=2 and 3 is 0.5600−0.3653 or 0.1947. Advantageously, the Cft calculations do not depend on the initial state of Ct which itself is heavily dependent on the possibly inaccurate estimate of Cer. Rather, the Cft calculations depend on the change in capacity (delta RSOC) which is derived from relatively accurate coulomb counting.

The relatively good agreement between the various Cft estimates reveals a high confidence factor in the result.

Advantageously, the Cft calculations may be performed without reference to the previous Cft value (2,050 mah). In a similar manner, using some combined Cft estimate (e.g., Cft=2,045 mah) we can recalculate corrected Ct values (Cct) from the Table 2a utilizing Cct=Trc.IRSOCi[i]* Cft:

TABLE 2c

| Index: i | Actual RSOCt: Trc.RSOCi | Ecpt at RSOCt: Trc.Ecpi | Capacity at interruption: Trc.Ct | Interpolated RSOCt: Trc.IRSOCi | Corrected Ct: Trc.Cct |
|---|---|---|---|---|---|
| 1 | 0.1951 | 3.652 | — | — | — |
| 2 | 0.3902 | 3.707 | 800 measured, 750 true | .3653 | 747 |
| 3 | 0.5853 | 3.783 | 1200 measured, 1150 true | .5600 | 1145 |
| 4 | 0.7805 | 3.914 | 1600 measured, 1550 true | .7566 | 1547 |

This Trc.Cct correction allows an accurate Ct estimate at the end of an interrupted charge cycle: Ct=Trc.Cct for the most recent charge interruption+delta Ct from that point to the end of charge. For example, using the data from Table 2c, assume that a charge cylce was terminated by a user when Trc.Ct=1,700 mah. At the most recent charge interruption, Trc.Cct=1,547 mah, and we have added 100 mah since that time, therefore the improved estimate of Ct is 1,547 mah+100 mah=1,647 mah, which is close to the "true" value of 1,650 mah.

Using the above approach, we have derived a good independent estimate (iCft and iCt) of both Cft and Ct at the end of charge, without recourse to a "qualified discharge cycle", and in the presence of a significant (50 mah) error in the original Ct estimate.

In addition, the projected reliability or quality of the Cft estimate can be made by comparing the Cft estimates (e.g., the 2,054 mah, 2,035 mah, and 2,044 mah from Table 2b) from each charge interruption indices. If there are many pairs in good agreement, then the quality QiCft may be characterized as high. If there are few pairs with poor agreement, then the quality QiCft may be characterized as low.

Adaptive Incremental Changes to Cft and Ct Based on the Quality of the Cft and Ct Estimates Definitions of additional terms pertinent to this section are detailed below.

tCft: The "true" full capacity is the actual total number of ampere-hours than can withdrawn from a full charged cell of battery. The tCft may change very slowly and somewhat unpredictably in response to factors such as charge/discharge regimes, operating and storage voltages, etc. This tCft value can not be readily measured.

eCft: An estimated value of the tCft value currently in use.

edCft: A delta (incremental) value subtracted from eCft to approximate known gradual capacity losses over time: eCft1=eCft0+edCft0. Typically used for open loop estimated correction for full capacity loss as a calculated function of voltage, temperature, and time.

qCft: A Cft estimate calculated from a "qualified discharge cycle" (QDC) used to replace eCft: eCft1=qCft1. Typically calculated as qcft=Cer (estimated remaining capacity at beginning of charge)+mah added during charge. Used to correct an eCft drift, but subject to significant Cer error, and requires either an accidental or deliberate qualified discharge cycle.

iCft: An "independent" Cft estimate calculated as the difference in the relative capacity levels at two different open circuit time intervals divided by an difference in associated relative state of charge levels at those open circuit time intervals. This estimate may be subject to some measurement noise which can be well estimated however by QiCft.

Each of the estimates may be considered to have an associated quality (or weight):

QeCft: quality of the eCft estimate. Very high initially, but gradually reduces to drift, to the point where a QDC might be requested.

QqCft: quality of the qCft estimate. Zero unless a deliberate or opportunistic QDC has occurred: not very high in any case, due to problems with Cer estimation.

QiCft: quality of the independent iCft estimate using the new method above: variable from low to high.

With these new terms above, we can calculate a weighted (or blended) eCft combining the each of the estimates and qualities above as detailed in equations (3) and (4).

$$Qt=(QeCft+QqCft+QiCft) \quad (3)$$

$$eCft1=QeCft/Qt*(eCft0+edCft0)+QqCft/Qt*qCft+QiCft/Qt*iCft \quad (4)$$

A QDC may still be requested when Qt is low. However such a QDC should be needed far less often, if at all, as QiCft should be fairly high on most charge cycles Updating Trc to Account for Cell Changes Over Time In normal operation, the initial Trc should provide reliable operation over the life of the cell, as long as the initial RSOCt/Ecpt holds true. It is, however, possible and practical to update Trc in normal operation to account for unanticipated gradual changes in cell chemistry, measurement circuitry, or usage conditions that may affect the RSOCt/Ecpt relationship.

In particular, if:
1. QqCft is relatively high due to an opportunistic QDC,
2. and if QiCft if fairly high, but less that during previous QDCs,
3. then the Trc.RSOCi and Trc.Ecpti values can be updated to more closely agree with the collected values in a manner analogous to the weighted eCft calculation.

xWt=xQqCft+xQiCft (the x indicates that these weights may not be identical to the weights above, as it is desirable to change the Trc values only very slowly)

(New Trc.RSOCi[i])=xQiCft/xWt * (old Trc.RSOCi[i])+ xQdCft/xWt * (Trc.Ct[i]/QCft), and (New Trc.Ecpi[i])=xQiCft/xWt * (old Trc.Ecpi[i])+xQdCft/xWt * (Trc.Ecpi[i]/QCft)

Operations

Figure 6:
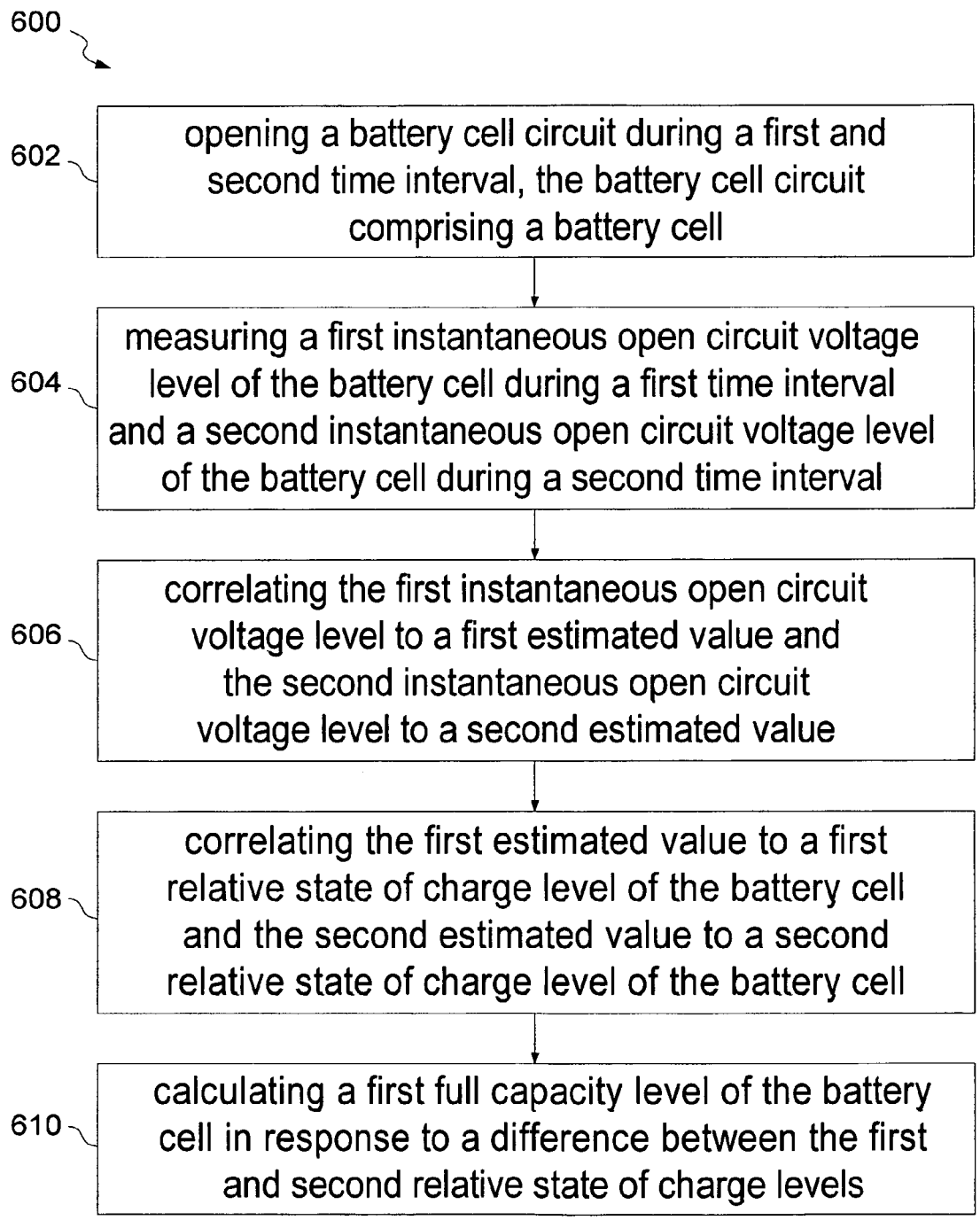
FIG. 6 is a flow chart of operations of an embodiment.

FIG. 6 is a flow chart 600 of operations consistent with an embodiment. Operation 602 includes opening a battery cell circuit during a first and second time interval. The battery cell circuit comprises a battery cell. In one example, this may entail interrupting charging between times t1 and t2 and between times t3 and t4 during a charging mode as illustrated in FIG. 5. Operation 604 includes measuring a first instantaneous open circuit voltage level of the battery cell during the first time interval (for example, Voct1) and a second instantaneous open circuit voltage level (for example, Voct2) of the battery cell during the second time interval. Operation 606 includes correlating the first instantaneous open circuit voltage level to a first estimated value (for example, Vcpt1) and said second instantaneous open circuit voltage level to a second estimated value (for example, Vcpt2). Operation 608 includes correlating the first estimated value to a first relative state of charge level of the battery cell and the second estimated value to a second relative state of charge level of said battery cell. Finally, operation 608 includes correlating a first full capacity level of the battery cell in response to a difference between said first and second relative state of charge levels.

It will be appreciated that the functionality described for all the embodiments described herein, may be implemented using hardware, firmware, software, or a combination thereof.

Thus, in summary, one embodiment may comprise an electronic device. The electronic device may comprise a storage medium having stored therein instructions that when executed by a machine result in the following: opening a battery cell circuit during a first and second time interval, the battery cell circuit comprising a battery cell; measuring a first instantaneous open circuit voltage level of the battery cell during the first time interval and a second instantaneous open circuit voltage level of the battery cell during the second time interval; correlating the first instantaneous open circuit voltage level to a first estimated value and the second instantaneous open circuit voltage level to a second estimated value; correlating the first estimated value to a first relative state of charge level of the battery cell and the second estimated value to a second relative state of charge level of the battery cell; and calculating a first full capacity level of the battery cell in response to a difference between the first and second relative state of charge levels.

In a further embodiment, the first time interval may be associated with a first capacity level of the battery cell and the second time interval may be associated with a second capacity level of the battery cell. The calculating operation may comprise dividing a difference between the first and second capacity levels by the difference between said first and second relative state of charge levels to obtain the first full capacity level.

Another embodiment may comprise a battery gas gauge circuit. The circuit may comprise: a switch network for coupling to a plurality of battery cells; an analog to digital converter (ADC) coupled to the switch network, the ADC adapted to accept an analog signal from each of a plurality of battery cells via the switch network and convert each the analog signal to an associated digital signal. The circuit may also comprise a processor capable of executing instructions stored in a storage medium to result in the following: instructing the switch network to open a battery cell circuit comprising one of the plurality of battery cells during a first and second time interval; instructing the switch network to couple terminals of the one of the plurality of battery cells to the ADC, the ADC adapted to provide the processor a first digital signal representative of a first instantaneous open circuit voltage level of the battery cell during the first time interval and a second digital signal representative of a second instantaneous open circuit voltage level of the battery cell during the second time interval; correlating the first digital signal to a first estimated value and the second digital signal to a second estimated value; correlating the first estimated value to a first relative state of charge level of the battery cell and the second estimated value to a second relative state of charge level of the battery cell; and calculating a first full capacity level of the battery cell in response to a difference between the first and second relative state of charge levels.

Advantageously, in these embodiments, the first and second relative state of charge levels applies to the same specific battery cell, not a general battery cell. Therefore, any errors introduced by possible variance between a generic table and a specific cell may be avoided. In addition, a correctly calibrated voltage reading is unnecessary for the first and second estimated values as long as certain estimated values yield repeatable relative stage of charge levels. This potentially reduces the effects of small voltage calibration errors.

If the first and second time intervals are relative short time intervals the first and second instantaneous open circuit voltage levels (Voct) will generally never closely approach associated theoretical open circuit voltage levels (Vcpt). However, such Voct levels can be used to generate repeatable estimated values (Ecpt). Therefore, the RSOC[Ecp] table can be built, used, and updated without reference to an externally provided RSOC[Vcp] table.

In addition, in cases when the RSOC can be independently and reliably measured/inferred (typically after any deep discharge/recharge cycle), the RSOC[Ecp] table can also be updated to reflect the new cell condition, thus accounting for cell ageing.

Despite the fact that Ecpt need not have any direct relationship to Vcpt for the algorithm to work, an estimator for Vcpt is still useful because:

1. Vcpt is largely insensitive to changes in charge current, temperature, etc. Voct measured during charge interruptions is highly sensitive to variations in (for example) charge current. By using (for example) Ecpt=Voct−(C0+C1*Icharge, where C0 and C1 are constants and Icharge is the average charge current prior to the charge interruption) we can create an estimator which is relatively insensitive to charge current, and therefore usable in a wider range of operating conditions. Other corrections for temperature, etc, can be added with the goal of creating an Ecpt which is dependent solely on RSOCt, with minimum effects from other independent variables.

2. To the extent that Voct measurement is accurately calibrated, and to the extent that Ecpt accurately models Vcpt, fixed Vcpt tables can be used interchangeably with the Ecpt. If use of fixed Vcpt tables yields a high confidence factor (as described below), the we have high confidence in all components of RSOCt measurement, There may be different Ecpt estimates and tables, each using different correction factors. The Ecpt value which yields the highest confidence factor may then be utilized.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

What is claimed is:

1. A method comprising:
opening a battery cell circuit during a first and second time interval, said battery cell circuit comprising a battery cell;
measuring a first instantaneous open circuit voltage level of said battery cell during said first time interval and a second instantaneous open circuit voltage level of said battery cell during said second time interval;
correlating said first instantaneous open circuit voltage level to a first estimated value and said second instantaneous open circuit voltage level to a second estimated value;
correlating said first estimated value to a first relative state of charge level of said battery cell and said second estimated value to a second relative state of charge level of said battery cell; and
calculating a first full capacity level of said battery cell in response to a difference between said first and second relative state of charge levels.

2. The method of claim 1, wherein said opening of said battery cell during said first and second time intervals comprises interrupting charging of said battery cell during a charging mode, and said method further comprises updating said first and second estimated values in response to a charging current level before said interrupting of said charging of said battery cell.

3. The method of claim 1, wherein said first time interval is associated with a first capacity level of said battery cell and said second time interval is associated with a second capacity level of said battery cell, and wherein said calculating operation comprises dividing a difference between said first and second capacity levels by said difference between said first and second relative state of charge levels to obtain said first full capacity level.

4. The method of claim 3, further comprising storing said first and second estimated values and said first and second relative state of charge levels, and updating said first and second estimated values and said first and second relative state of charge levels in response to additional openings of said battery cell circuit at additional time intervals associated with said first and second capacity levels.

5. The method of claim 1, further comprising:
opening said battery cell circuit during a third time interval;
measuring a third instantaneous open circuit voltage level of said battery cell during said third time interval;
correlating said third instantaneous open circuit voltage level to a third estimated value; correlating said third estimated value to a third relative state of charge level of said battery cell; and
calculating a second full capacity level of said battery cell in response to a difference between said second and third relative state of charge levels.

6. The method of claim 5, further comprising calculating a third full capacity level of said battery cell in response to a difference between said first and third relative state of charge levels, and comparing said first, second, and third full capacity levels to assess a reliability of each of said first, second, and third full capacity levels.

7. The method of claim 1, wherein said first estimated value is representative of a first theoretical open circuit voltage level and wherein said second estimated value is representative of a second theoretical open circuit voltage level.

8. An electronic device comprising:
a storage medium having stored therein instructions that when executed by a machine result in the following:
opening a battery cell circuit during a first and second time interval, said battery cell circuit comprising a battery cell;
measuring a first instantaneous open circuit voltage level of said battery cell during said first time interval and a second instantaneous open circuit voltage level of said battery cell during said second time interval;
correlating said first instantaneous open circuit voltage level to a first estimated value and said second instantaneous open circuit voltage level to a second estimated value;
correlating said first estimated value to a first relative state of charge level of said battery cell and said second estimated value to a second relative state of charge level of said battery cell; and
calculating a first full capacity level of said battery cell in response to a difference between said first and second relative state of charge levels.

9. The electronic device of claim 8, wherein said opening of said battery cell during said first and second time intervals comprises interrupting charging of said battery cell during a charging mode, and wherein said instructions that when executed by said machine also result in updating said first and second estimated values in response to a charging current level before said interrupting of said charging of said battery cell.

10. The electronic device of claim 8, wherein said first time interval is associated with a first capacity level of said battery cell and said second time interval is associated with a second capacity level of said battery cell, and wherein said calculating operation comprises dividing a difference between said first and second capacity levels by said difference between said first and second relative state of charge levels to obtain said first full capacity level.

11. The electronic device of claim 10, wherein said instructions that when executed by said machine also result in storing said first and second estimated values and said first and second relative state of charge levels, and updating said first and second estimated values and said first and second relative state of charge levels in response to additional openings of said battery cell circuit at additional time intervals associated with said first and second capacity levels.

12. The electronic device of claim 8, wherein said instructions that when executed by said machine also result in:
opening said battery cell circuit during a third time interval;
measuring a third instantaneous open circuit voltage level of said battery cell during said third time interval;
correlating said third instantaneous open circuit voltage level to a third estimated value;
correlating said third estimated value to a third relative state of charge level of said battery cell; and
calculating a second full capacity level of said battery cell in response to a difference between said second and third relative state of charge levels.

13. The electronic device of claim 12, wherein said instructions that when executed by said machine also result in calculating a third full capacity level of said battery cell in response to a difference between said first and third relative state of charge levels, and comparing said first, second, and third full capacity levels to assess a reliability of each of said first, second, and third full capacity levels.

14. The electronic device of claim of claim 8, wherein said first estimated value is representative of a first theoretical open circuit voltage level and wherein said second estimated value is representative of a second theoretical open circuit voltage level.

15. A battery gas gauge circuit comprising:
a switch network for coupling to a plurality of battery cells;
an analog to digital converter (ADC) coupled to said switch network, said ADC adapted to accept an analog signal from each of a plurality of battery cells via said switch network and convert each said analog signal to an associated digital signal; and
a processor capable of executing instructions stored in a storage medium to result in the following:
instructing said switch network to open a battery cell circuit comprising one of said plurality of battery cells during a first and second time interval;
instructing said switch network to couple terminals of said one of said plurality of battery cells to said ADC, said ADC adapted to provide said processor a first digital signal representative of a first instantaneous open circuit voltage level of said battery cell during said circuit time interval and a second digital signal representative of a second instantaneous open circuit voltage level of said battery cell during said second time interval;
correlating said first digital signal to a first estimated value and said second digital signal to a second estimated value;
correlating said first estimated value to a first relative state of charge level of said battery cell and said second estimated value to a second relative state of charge level of said battery cell; and
calculating a first full capacity level of said battery cell in response to a difference between said first and second relative state of charge levels.

16. The circuit of claim 15, wherein said first time interval is associated with a first capacity level of said battery cell and said second time interval is associated with a second capacity level of said battery cell, and wherein said calculating operation comprises dividing a difference between said first and second capacity levels by said difference between said first and second relative state of charge levels to obtain said first full capacity level.

17. The circuit of claim 16, wherein said instructions that when executed by said machine also result in storing said first and second estimated values and said first and second relative state of charge levels, and updating said first and second estimated values and said first and second relative state of charge levels in response to additional openings of said battery cell circuit at additional time intervals associated with said first and second capacity levels.

18. The circuit of claim 15, wherein said wherein said instructions that when executed by said processor also result in:
   opening said battery cell circuit during a third time interval; measuring a third instantaneous open circuit voltage level of said battery cell during said third time interval;
   correlating said third instantaneous open circuit voltage level to a third estimated value; correlating said third estimated value to a third relative state of charge level of said battery cell; and
   calculating a second full capacity level of said battery cell in response to a difference between said second and third relative state of charge levels.

19. The circuit of claim 18, wherein said instructions that when executed by said processor also result in calculating a third full capacity level of said battery cell in response to a difference between said first and third relative state of charge levels, and comparing said first, second, and third full capacity levels to assess a reliability of each of said first, second, and third frill capacity levels.

20. The circuit of claim 15, wherein said first estimated value is representative of a first theoretical open circuit voltage level and wherein said second estimated value is representative of a second theoretical open circuit voltage level.

* * * * *